United States Patent [19]

Meng

[11] Patent Number: 5,587,608

[45] Date of Patent: Dec. 24, 1996

[54] STRUCTURE HEAT SINK FOR POWER SEMICONDUCTORS

[76] Inventor: Ching-Ming Meng, No. 59, Jinn Shiun 2nd St., Yangmei City, Taoyuan, Taiwan

[21] Appl. No.: 549,231

[22] Filed: Oct. 27, 1995

[51] Int. Cl.⁶ .............................. H01L 23/34; H01L 23/28
[52] U.S. Cl. ...................... 257/712; 257/706; 257/718; 257/722; 257/796
[58] Field of Search ................................... 257/712, 706, 257/711, 718, 722, 796

[56] References Cited

U.S. PATENT DOCUMENTS

| | | | |
|---|---|---|---|
| 4,054,901 | 10/1977 | Edwards et al. | 257/718 |
| 4,509,839 | 4/1985 | Lavochkin | 257/718 |
| 4,710,852 | 12/1987 | Keen | 257/718 |
| 5,444,304 | 8/1995 | Hara et al. | 257/796 |

*Primary Examiner*—Mahshid Saadat
*Assistant Examiner*—Jhihan Clark

*Attorney, Agent, or Firm*—Morton J. Rosenberg; David I. Klein

[57] ABSTRACT

An improved structure of a heat sink for power semiconductors is provided in the form of a U-shaped heat sink extruded from an aluminum material. The heat sink has a number of individual and oppositely juxtaposed heat dissipation fins formed along the inside and the outside surfaces of the two lateral walls thereof. The heat sink has two fastener plates slanting downward respectively from inner surfaces of the lateral walls and extending an appropriate length. A pair of fastener tabs are individually punched out and bent inward in opposed juxtaposition at the rear end of the two lateral walls. The heat sink includes heat dissipation fins that are directly formed continuously along opposing sides of the two lateral walls of a U-shaped heat sink. The height of the fastener plates and fastener tabs are both slightly lower than the thickness of the front and rear ends of the power semiconductor, with the front ends thereof slanted upwardly to form push-pull insertion guide surfaces to permit the power semiconductor to be directly and smoothly clip mounted to the heat sink.

2 Claims, 5 Drawing Sheets

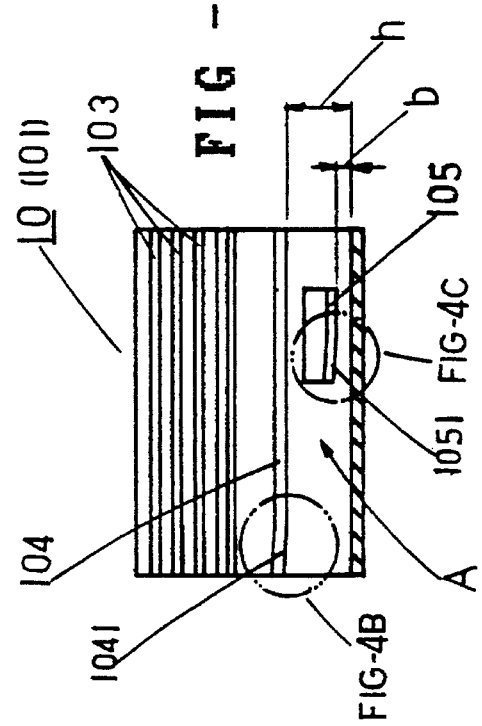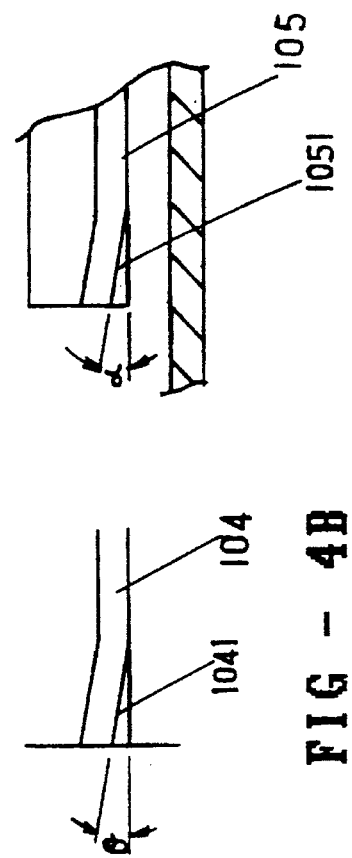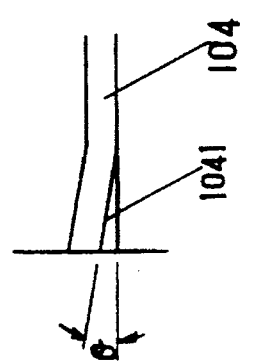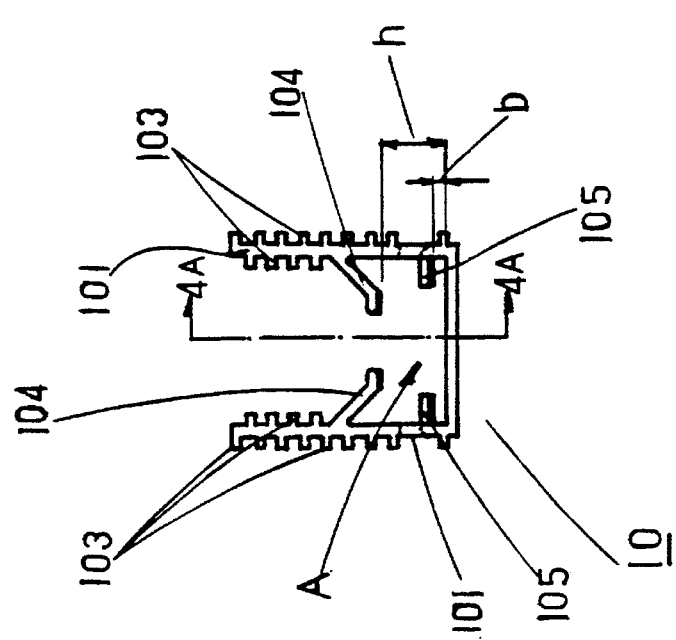

STRUCTURE HEAT SINK FOR POWER SEMICONDUCTORS

BACKGROUND OF THE INVENTION

Conventional heat sinks for power semiconductors are attached to power semiconductors through an integrated assembly and, as indicated in FIG. 1, mainly consist of a heat sink 10 fabricated from an aluminum piece of material. The heat sink is formed into a U-shape and has two lateral walls 101 designed with a predetermined number of open slots 1011 that form a certain number of rapid cooling heat dissipation fins 1012, and has a mounting hole 102 suitably positioned in the bottom section thereof to provide for the insertion of a screw 20. The through-hole 3011 formed in the mounting tab 301, at the rear end of the power transistor 30, is utilized to assemble the heat sink 10 to the power semiconductor 30. The assembly personnel directly insert the screw 20 into the same hole 3011 and the mounting hole 102, and then install the supporting nut 21 to effectively achieve the tightening of the assembly. Following that assembly procedure, the high temperatures produced during the operation of the aforesaid power semiconductor 30 are directly transferred to the heat sink 10. The heat dissipation fins 1012 function to effectively dissipate heat which lowers the temperature of the power semiconductor 30. It cannot be denied that this method of assembly such a heat sink 10 to a power semiconductor 30, with regard to providing for the operation of the power semiconductor 30, actually is effective and has value. Furthermore, at present there are many commonplace methods of heat dissipation for power semiconductors, however, following the long-term utilization of such methods, manufacturers have found that, in actuality, the fabrication and utilization of the aforesaid heat sinks and methods are unsatisfactory to many people, and have shortcomings that await necessary improvement, specifically:

1. Since the assembly of the aforesaid power semiconductor 30 to the heat sink 10 requires a screw 20 and a nut 21 to achieve fastening, the installation of the aforesaid screw and nut, in addition to directly increasing material costs, each power semiconductor 30 and heat sink 10 assembly operation must also be accompanied by a fastening operation. The actual assembly of power semiconductor 30 to heat sink 10 is subject to the shortcomings of being troublesome, inconvenient, and inefficient as such is wasteful of time and effort.

2. Due to the different lengths of the aforesaid heat sink, which must be utilized with different power semiconductors, the spacing between the cut slots 1011 in the two lateral walls 101 of the U-shaped heat sink 10 must be based on a dimension that is commensurate with the length of the heat sink 10. Thus, the length determination enables the determination of slot spacing and thereby the number of heat dissipation fins. Obviously, the tools utilized for forming slots 1011 in each heat sink 10 of different lengths are of necessity all dissimilar and cannot be commonly utilized, and must be individually fabricated. As such, with regard to utilization and fabrication of the tools, the scope of practical utilization is limited, and is relatively uneconomical, in that the numerous tools require storage space and management.

3. The forming of the U-shaped heat sink 10 mainly consists of press rolling aluminum material into a flat plate of suitable thickness and suitable width, and then utilizing a punch press preset to a predesigned spacing of slots 1011, forming the slots and mounting hole 102. Then, another punch press is utilized to form and bend two lateral walls of heat dissipation fins 1012, and then finally, a cutting tool is used to form heat sinks of a set length. Therefore, in terms of the actual fabrication and the fabrication process, numerous tools must be prepared, the various tools requiring close matching. Therefore, the process has the shortcomings of being relatively uneconomical, being difficult, and being inconvenient.

4. Since the aforesaid power semiconductor 30 and the heat sink 10 are assembled together, and involves fastening with a screw 20 and a nut 21, the mounting tab 301 at the rear end of the aforesaid power semiconductor must have a through-hole 3011 formed in the mounting surface. Although the placement of the aforesaid through-hole 3011 is not difficult, it is troublesome in that this increases the overall fabrication procedure.

Therefore, in view of the foregoing substantiations it must be acknowledged that the aforesaid conventional heat sink for power semiconductors obviously has a number of shortcomings in actual utilization and, furthermore, requires improvements in design.

SUMMARY OF THE INVENTION

The primary objective of the invention disclosed herein is to provide an improved structure of a heat sink for power semiconductors, of which the efficiency of its heat dissipation is provided by a certain number of heat dissipation fins that are directly extruded on a U-shaped heat sink. The fins are formed in the same direction and are of individual design and layout on the inside and the outside of two lateral walls. The disclosed U-shaped heat sink and its heat dissipation fins are directly formed through extrusion, and does not require, as in the conventional technology, an additional auxiliary tool entailing a separate punch cut and bending operation. Thus, the disclosed heat sink effectively provides more economic effectiveness, speed, as well as simplicity and convenience than the conventional technology previously discussed.

Another objective of the invention herein is to provide an improved structure of a heat sink for power semiconductors, of which approximately at the center section of the inner surfaces of the two walls of the disclosed U-shaped heat sink are formed fastener plates, oppositely juxtaposed and downwardly slanting. The fastener plates extend for an excessive length and are slightly lower than the thickness of the front end of the power semiconductor. The disclosed heat sink also has fastener tabs that are suitably positioned at the rear end of the two lateral walls and consist of separate, inward facing, punched out entities that are oppositely and mutually juxtaposed. The fastener tabs are disposed slightly lower than the mounting tab at the rear end of the power semiconductor, and at the front ends of the fastener plates and fastener tabs are individual pre-positioned upward slanting push-pull insertion guides, such that the power semiconductor can be directly and smoothly inserted through the push-pull insertion guide surfaces, enabling the fastener plates and the fastener tabs to be securely, stably and positively clipped into position. Therefore, the assembly procedure is obviously more simple than the screw and nut fastening method of the conventional method. Thus, the disclosed heat sink provides greater working efficiency through simplicity, convenience, speed and other efficiencies. In terms of parts cost, a direct savings is obtained by eliminating the purchase of the screws and nuts formerly required.

Yet another objective of the invention herein is to provide a kind of improved structure of a heat sink for power semiconductors, of which the heat dissipation fins are prefabricated through extrusion of the heat sink itself. The number of fins and the spacing therebetween is unaffected by changes in the length of the heat sink. Thus, the disclosed heat sink can be fabricated from long bar of material, through direct extrusion, and at the same time to meet particular utilization requirements, an individual heat sink can be cut at any length whatsoever and thereby enable the direct forming of heat sinks of different lengths using the same tools. This obviously enables the fabrication procedures to be more convenient, simple and rapid.

BRIEF DESCRIPTION OF THE DRAWINGS

FIG. 3 is an end elevation view of the heat sink of the present invention;

FIG. 4A is a cross-sectional drawing of the heat sink of the present invention taken along the section line 4A—4A of FIG, 3;

FIG. 4B is an enlarged view of the guide surface of a fastener plate of the present invention;

FIG. 4C is an enlarged view of the guide surface of a fastener tab of the present invention;

DESCRIPTION OF THE PREFERRED EMBODIMENT

Figure 1:
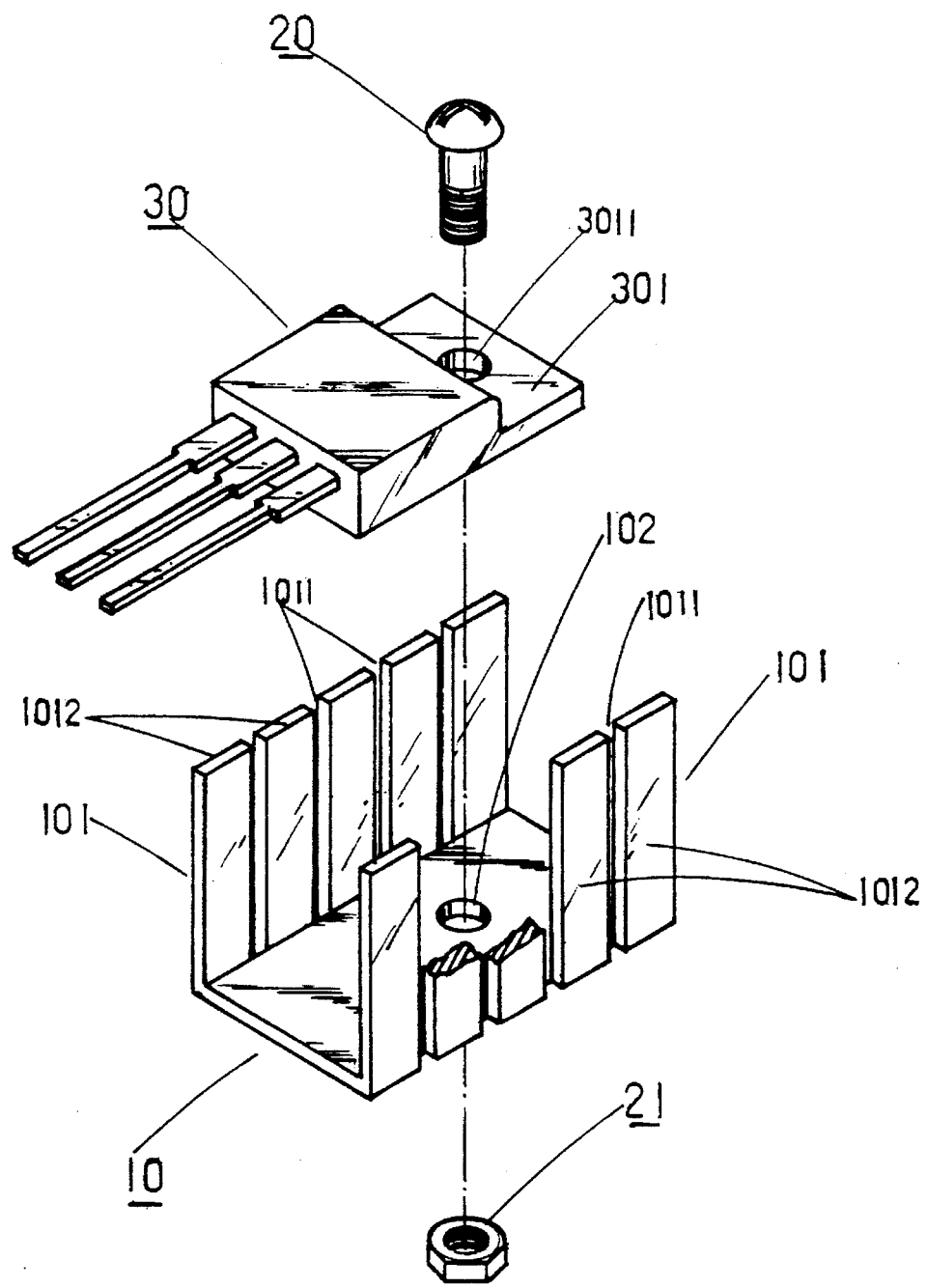
FIG. 1 is an exploded structural drawing of a conventional heat sink for power semiconductors depicting its assembly to a power semiconductor.
Figure 2:
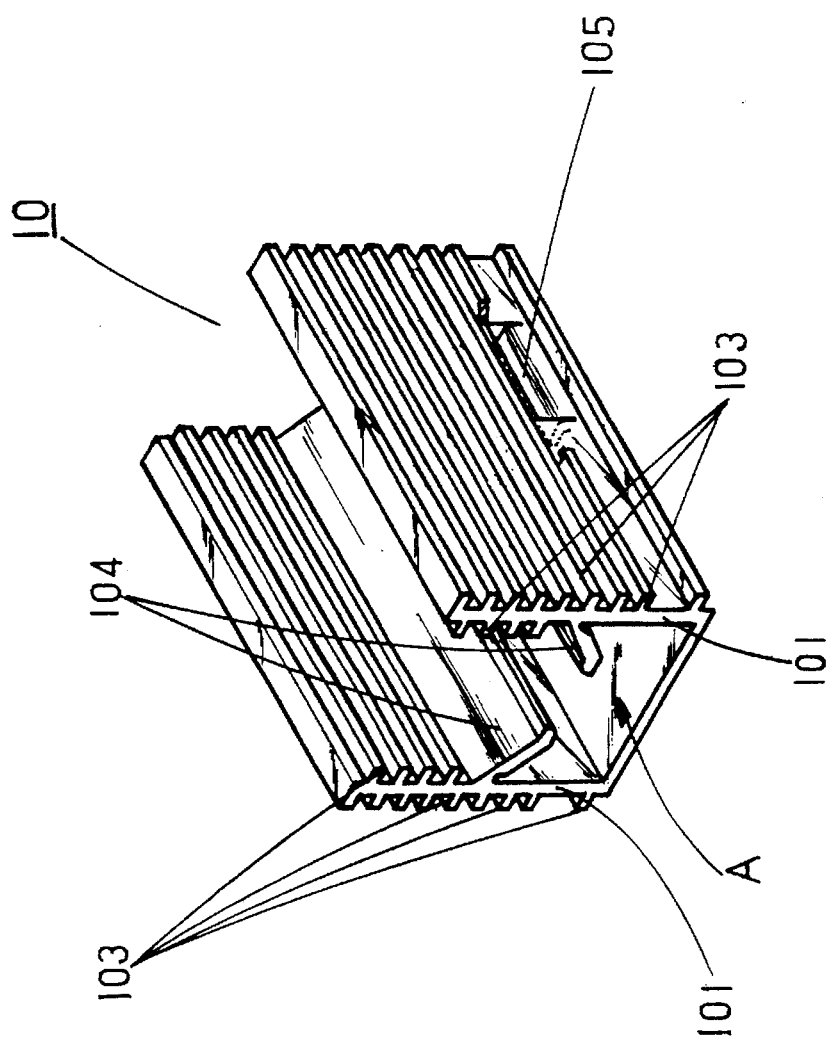
FIG. 2 is a perspective view of the heat sink of the present invention.

Referring to FIGS. 2–5, there is shown, an improved structure of a heat sink for power semiconductors. The U-shaped heat sink 10 is fabricated by direct extrusion from aluminum alloy. Extruded at the same time along the area of the two lateral walls 101 along the inside and outside of the lateral walls are a number of heat dissipation fins 103, extruded according to a previously determined design and layout. Also extruded are fastener plates 104, the fastener plates 104 being oppositely facing and extending downwardly for a suitable length. Fastener tabs 105 are suitably positioned at the rear ends of the outer sides. The fastener tabs 105 are fabricated by punching a portion of the lateral side walls 101 inward to form a bend. Between the bottom surface of the two fastener plates 104 and the upper surface of the bottom section of the U-shaped heat sink 10 is a containment slot A of height h, which height is prefabricated slightly less than the thickness at the front end of the power semiconductor 30. The front end of each fastener plate 104 has a push-pull insertion guide surface 104 slanting upwardly at an angle of θ. Furthermore, the height b between the upper surface of the bottom section of the U-shaped heat sink 10 and the bottom surface of the two inwardly bent and oppositely positioned fastener tabs 105 is slightly less than the thickness of the mounting tab 301 at the rear end of the power semiconductor 30 and forms a second portion of containment slot A. The front end of each fastening tab 105 has a push-pull insertion guide surface 1051 slanting upwardly at an angle of α.

Figure 5:
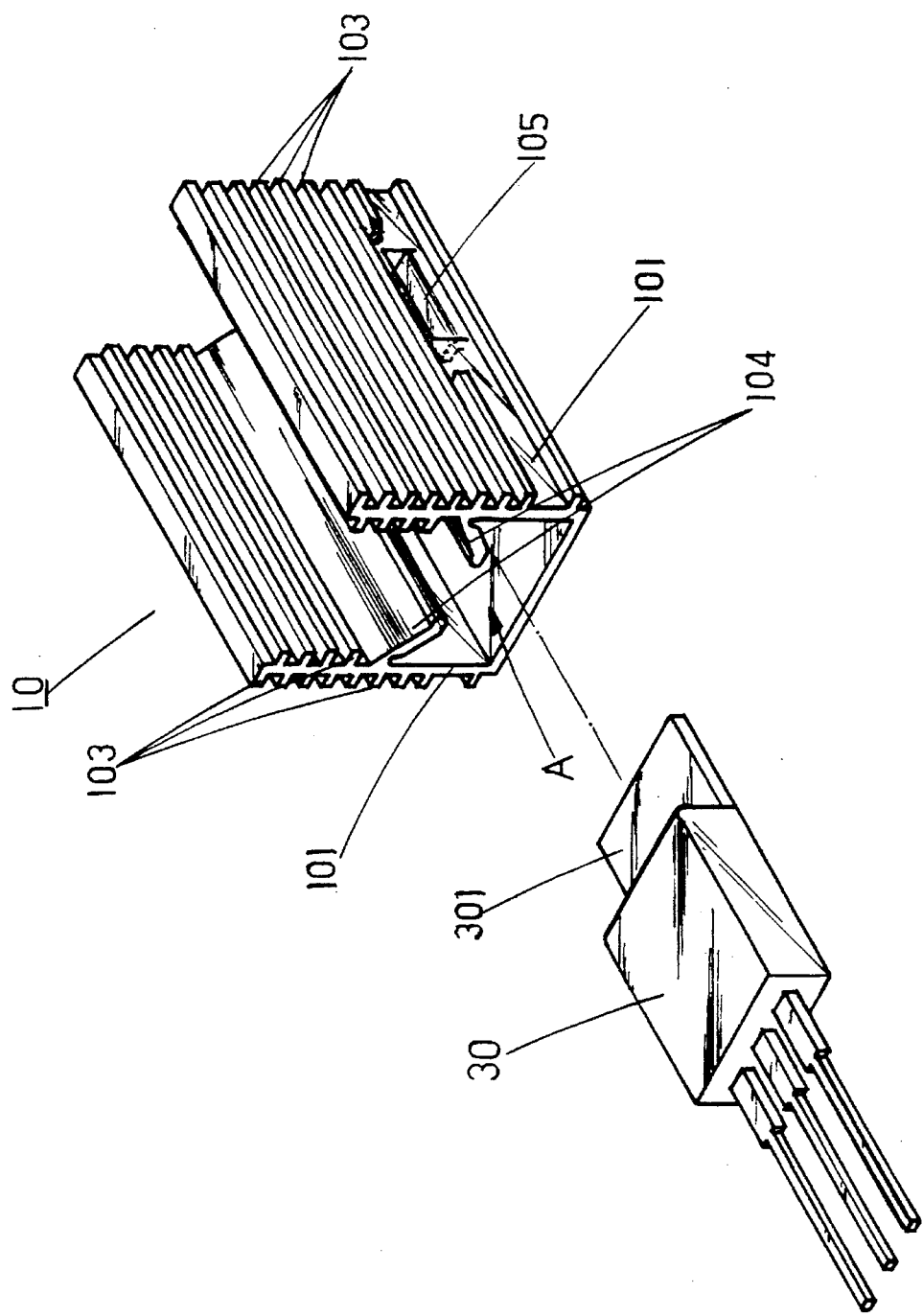
FIG. 5 is a perspective view of the heat sink of the present invention depicting assembly to a power semiconductor; and, FIG. 6 is a cross-sectional view of the heat sink of the present invention assembled to a power semiconductor.
Figure 6:
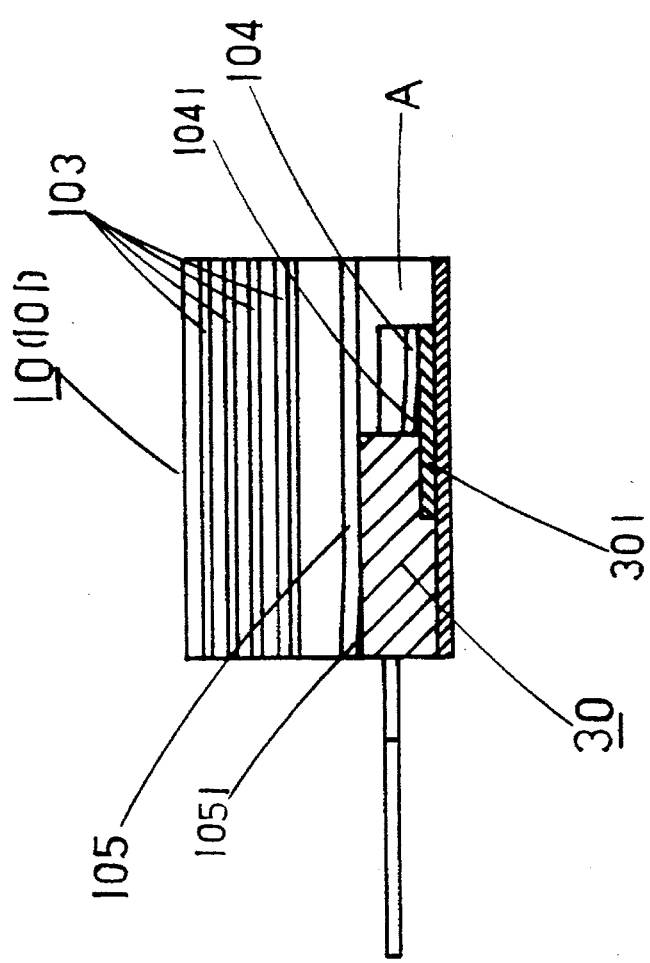

As indicated in FIG. 5 and FIG. 6, due to the height of the containment slot A formed in between the bottom section of heat sink 10 and the two fastener plates 104 and the two fastener tabs 105, and with the aluminum alloy fastener plates 104 and fastener tabs 105 having the appropriate degree of tensile force, the power semiconductor 30 is clip mounted in a manner that is accurate, durable and firm. The upwardly slanting push-pull insertion guide surface 1041 and 1051 permit an individual to directly and easily insert the mounting tab 301 at the rear end of the power semiconductor 30 along the push-pull insertion guide surfaces 1051 within the second portion of containment slot A of the heat sink 10 along with the front end of power semiconductor 30 being inserted along the insertion guide surfaces 1041. The insertion of the front end of the power semiconductor 30 and the rear end of the mounting tab 301 is extremely smooth and accomplished without difficulty. Since the height of the fastener tabs 105 is lower than that of the fastener plates 104, the fastener tabs 105 also act as a stop. After the mounting tab 301, at the rear end of the power semiconductor 30, is completely inserted beneath the fastener tabs 105, the front end of the fastener tabs 105 are adjacent to the rear end of the front end portion of the power semiconductor 30. By the intersection of the power semiconductor 30 and the mounting tab 301, such are held stationary, enabling the power semiconductor 30 to be effectively anchored and positioned. Therefore, the attachment of the power semiconductor to the heat sink of the instant invention is achieved without the requirement for screws and nuts, as required by conventional methods, through a procedure involving the direct insertion of the power semiconductor 30 into the containment slot A of the heat sink.

Furthermore, the U-shaped heat sink 10 is provided with heat dissipation fins 103 having a predetermined spacing, number, design and layout on the inside and outside surfaces of the two lateral walls 101. The heat dissipation fins 103 are fabricated through direct extrusion of the U-shaped heat sink 10. The design of the fins 103 are not subject to considerations based on the length of the heat sink, obviating the need for different designs for heat sinks of different lengths and the multitude of different tools which would otherwise be required. The aforesaid heat dissipation fins 103 and the heat sink 10 are fabricated by a single combined extrusion process, that not only specifically provides for required operational heat dissipation efficiency, but can be produced through the direct extrusion of long bars. That method of fabrication facilitates utilization, by enabling the simple, convenient and rapid cutting of the long bars into any length, to directly form heat sinks in a range of different lengths.

Since the front ends of the fastener plates 104 and the fastener tabs 105 each have respective upwardly slanting push-pull insertion guide surfaces 1041 and 1051, the fabrication of heat sink 10 does not require an extreme degree of precision. An individual can, during the punching out and bending of the two fastener tabs 105, directly and simply displace the front ends of the fastener plates 104 and the fastener tabs 105 to form the push-pull insertion guide surfaces, which can be simply, conveniently and accurately achieved at the appropriate time to complete the overall fabrication in a concise, convenient and economical manner. U-shaped heat sink 10, therefore, provides a more simple, convenient and economical system for coupling to a power semiconductor 30.

What is claimed is:

1. An improved extruded aluminum heat sink structure for coupling to a power semiconductor device, comprising a longitudinally extended body member having a U-shaped cross-sectional contour defined by a pair of upright lateral walls disposed on opposing longitudinal sides of a bottom wall, each of said lateral walls having opposing inner and outer side surfaces and a plurality of longitudinally extended heat dissipation fins integrally formed and extending from both said inner and said outer side surfaces in spaced parallel relationship, said body member having a pair of fastener plates integrally formed and extending respectively from said inner side surfaces of said pair of lateral walls, each of said fastener plates being inclined toward said bottom wall and spaced therefrom by a first predetermined dimension to form a containment slot for receiving a body portion of the power semiconductor device therein, said body member having a pair of fastener tabs respectively extending from said inner side surfaces of said pair of lateral walls into said containment slot, each of said fastener tabs being formed by displacement of a portion of a respective lateral side wall subsequent to extrusion of said body member in one piece, each of said fastener tabs being spaced from said bottom wall by a second predetermined dimension to define a second portion of said containment slot, said first predetermined dimension being less than a thickness dimension of the body portion of the power semiconductor device and said second predetermined dimension being less than a thickness dimension of a mounting tab portion of the power semiconductor device for securement of the body portion of the power semiconductor device within said first portion of said containment slot and the mounting tab portion thereof with in said second portion of said containment slot.

2. The improved extruded aluminum heat sink structure as recited in claim 1 where each of said pair of fastener plates and each of said pair of fastener tabs have front end portions angularly inclined to form an insertion guide surface for insertion of respective portions of the power semiconductor device into said first and second portions of said containment slot.

* * * * *